United States Patent
Kim et al.

(10) Patent No.: US 9,349,851 B2
(45) Date of Patent: May 24, 2016

(54) SEMICONDUCTOR DEVICE AND METHOD OF FORMING THE SAME

(71) Applicant: Samsung Electronics Co., Ltd., Suwon-si (KR)

(72) Inventors: Yoonhae Kim, Suwon-si (KR); Hong Seong Kang, Hwaseong-si (KR); Junjie Xiong, Suwon-si (KR); Yoonseok Lee, Seoul (KR); Youshin Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 14/140,616

(22) Filed: Dec. 26, 2013

(65) Prior Publication Data

US 2014/0191312 A1 Jul. 10, 2014

(30) Foreign Application Priority Data

Jan. 4, 2013 (KR) .................. 10-2013-0001223

(51) Int. Cl.
| | |
|---|---|
| *H01L 29/66* | (2006.01) |
| *H01L 29/78* | (2006.01) |
| *H01L 29/49* | (2006.01) |
| *H01L 21/8234* | (2006.01) |
| *H01L 29/51* | (2006.01) |

(52) U.S. Cl.
CPC ........ *H01L 29/78* (2013.01); *H01L 21/823468* (2013.01); *H01L 21/823475* (2013.01); *H01L 29/4966* (2013.01); *H01L 29/66545* (2013.01); *H01L 29/51* (2013.01)

(58) Field of Classification Search
CPC ............... H01L 21/823468; H01L 21/823475; H01L 29/4966; H01L 29/78
See application file for complete search history.

(56) References Cited

U.S. PATENT DOCUMENTS

| | | | |
|---|---|---|---|
| 6,271,108 B1 | 8/2001 | Choe | |
| 6,686,286 B2 | 2/2004 | Yoon | |
| 7,122,850 B2 | 10/2006 | Nam et al. | |
| 7,923,321 B2 | 4/2011 | Lai et al. | |
| 7,939,392 B2 | 5/2011 | Chung et al. | |
| 7,977,181 B2 | 7/2011 | Lai et al. | |
| 7,985,690 B2 | 7/2011 | Thei et al. | |
| 8,093,120 B2 | 1/2012 | Yeh et al. | |
| 8,222,132 B2 | 7/2012 | Lee et al. | |
| 2002/0142606 A1* | 10/2002 | Yoon | .............................. 438/694 |

(Continued)

FOREIGN PATENT DOCUMENTS

| | | |
|---|---|---|
| KR | 1020020014236 A | 2/2002 |
| KR | 1020060073818 A | 6/2006 |

(Continued)

*Primary Examiner* — John C Ingham
*Assistant Examiner* — Frederick B Hargrove
(74) *Attorney, Agent, or Firm* — Myers Bigel & Sibley, P.A.

(57) ABSTRACT

A semiconductor device includes a substrate having an active region and a device isolation layer defining the active region, a gate electrode on the active region, source/drain regions at the active region at both sides of the gate electrode, a buffer insulating layer on the device isolation layer, an etch stop layer formed on the buffer insulating layer and extending onto the gate electrode and the source/drain region, a first interlayer insulating layer on the etch stop layer, a first contact and a second contact penetrating the first interlayer insulating layer and the etch stop layer. The first contact and the second contact are spaced apart from each other and are in contact with the source/drain region and the buffer insulating layer, respectively.

19 Claims, 16 Drawing Sheets

(56) References Cited

U.S. PATENT DOCUMENTS

| | | | |
|---|---|---|---|
| 2007/0096212 A1* | 5/2007 | Sato | H01L 21/76895 257/350 |
| 2010/0078728 A1 | 4/2010 | Li et al. | |
| 2010/0270627 A1* | 10/2010 | Chang et al. | 257/411 |
| 2010/0285658 A1* | 11/2010 | Yeh et al. | 438/586 |
| 2014/0151763 A1* | 6/2014 | Hung et al. | 257/288 |

FOREIGN PATENT DOCUMENTS

| | | |
|---|---|---|
| KR | 1020060076398 A | 7/2006 |
| KR | 1020090040991 A | 4/2009 |

\* cited by examiner

SEMICONDUCTOR DEVICE AND METHOD OF FORMING THE SAME

CROSS-REFERENCE TO RELATED APPLICATION

This U.S. non-provisional patent application claims priority under 35 U.S.C. §119 to Korean Patent Application No. 10-2013-0001223, filed on Jan. 4, 2013, the entirety of which is incorporated by reference herein.

BACKGROUND

The inventive concept relates to semiconductor devices and methods of forming the same.

A field effect transistor (hereinafter, referred to as "a transistor") is an important constituent element of many semiconductor devices. Generally, the transistor includes a source and a drain that are spaced apart from each other in a semiconductor substrate and a gate covering a channel that extends between the source and the drain. The source and drain may be formed by implanting dopant ions into the semiconductor substrate, and the gate is insulated from the channel by a gate insulating layer that is disposed between the channel portion of the semiconductor substrate and the gate. Transistors are widely used as a switching element and/or a discrete element constituting a logic circuit in semiconductor devices. Recently, operating speeds of the semiconductor devices have been increased, while the sizes of the transistors have been reduced to provide more highly integrated semiconductor devices.

SUMMARY

Embodiments of the inventive concept may provide semiconductor devices including transistors having improved reliability.

Embodiments of the inventive concept may also provide methods of forming a semiconductor device including a transistor having improved reliability.

In one aspect, a semiconductor device may include: a substrate having an active region and a device isolation layer that defines the active region; a gate electrode on the active region; source/drain region at a side of the gate electrode; a buffer insulating layer on the device isolation layer; an etch stop layer on the buffer insulating layer and extending onto the gate electrode and the source/drain regions; a first interlayer insulating layer on the etch stop layer; and a first contact and a second contact, each of which penetrates the first interlayer insulating layer and the etch stop layer, the first contact and the second contact contacting the source/drain region and the buffer insulating layer, respectively, and the first and second contacts spaced apart from each other.

In some embodiments, a top surface of the buffer insulating layer may be higher than a top surface of the source/drain region; and the top surface of the buffer insulating layer may be disposed at substantially the same height as a top surface of the gate electrode.

In some embodiments, the gate electrode may extend onto the device isolation layer; and the second contact may also be in direct contact with a top surface of the gate electrode on the device isolation layer.

In some embodiments, a bottom surface of the second contact may be higher than a top surface of the source/drain region.

In some embodiments, the source/drain region may include an elevated portion that extends above the substrate; and a top surface of the elevated portion may be higher than a bottom surface of the gate electrode.

In some embodiments, the source/drain region may have a protrusion protruding that extends onto the device isolation layer.

In some embodiments, the semiconductor device may further include: a second interlayer insulating layer on the first interlayer insulating layer; and a third contact penetrating the second interlayer insulating layer and contacting a top surface of the first contact. In this case, the second contact may further penetrate the second interlayer insulating layer; and the second contact may include the same material(s) as the third contact.

In another aspect, a semiconductor device is provided that includes a substrate having a device isolation region and an active region; a gate electrode on the substrate that crosses the active region, the gate electrode including a portion that extends onto the device isolation region; a source/drain region that extends above the substrate on a first side of the gate electrode; a buffer insulating layer on the device isolation region between the source/drain region and the portion of the gate electrode that extends onto the device isolation region; and a contact on the portion of the gate electrode that extends onto the device isolation region and on the buffer insulation layer. A top surface of the buffer insulation layer is higher above the substrate than is a top surface of the source/drain region.

In some embodiments, the source/drain region extends onto the device isolation region.

In some embodiments, the semiconductor device further includes an etch stop layer on the source/drain region and on the buffer insulation layer.

In some embodiments, the contact comprises a first contact, the semiconductor device further includes an interlayer insulating layer on the etch stop layer and a second contact, where the first and second contacts each penetrate the interlayer insulating layer and the etch stop layer so that the first contact electrically connects to the gate electrode and the second contact electrically connects to the source/drain region. The first contact may be spaced apart from the second contact.

In some embodiments, the entirety of the contact is above the buffer insulating layer and the gate electrode.

In some embodiments, the top surface of the buffer insulating layer is substantially coplanar with a top surface of the gate electrode.

In some embodiments, the top surface of the source/drain region is higher above the substrate than is a bottom surface of the gate electrode.

In some embodiments, the semiconductor device further includes a metal silicide region in an upper surface of the source/drain region. In these embodiments, the etch stop layer may be between the metal silicide region in the upper surface of the source/drain region and the gate electrode.

In another aspect, a method of forming a semiconductor device may include: forming a gate electrode on a substrate having an active region and a device isolation layer that defines the active region; forming source/drain region at a side of the gate electrode; forming a buffer insulating layer on the device isolation layer, the buffer insulating layer having a top surface that is higher above the substrate than is a top surface of the source/drain region; sequentially forming an etch stop layer and a first interlayer insulating layer on the buffer insulating layer, the gate electrode and the source/drain region; etching the first interlayer insulating layer and the etch stop layer to form a first hole exposing the source/drain region; forming a first contact in the first hole; forming a second interlayer insulating layer on the first interlayer insulating layer and the first contact; forming a second hole penetrating the second interlayer insulating layer and a third hole penetrating the second interlayer insulating layer, the first interlayer insulating layer and the etch stop layer at the same time, the second hole exposing the first contact, and the third hole exposing the gate electrode and the buffer insulating layer adjacent to the gate electrode; and forming a second contact and a third contact in the second hole and the third hole, respectively.

In some embodiments, a bottom surface of the third contact may be formed to be higher than a top surface of the source/drain region.

In some embodiments, the source/drain region may be formed by a selective epitaxial growth (SEG) process on the substrate; the source/drain region may have a top surface higher than a bottom surface of the gate electrode; and the source/drain region may have a protrusion that extends from the active region onto the device isolation layer.

In still another aspect, a method of forming a semiconductor device may include: forming a preliminary gate electrode on a substrate having an active region and a device isolation layer that defines the active region; forming source/drain region at a side of the preliminary gate electrode; forming a sacrificial layer covering the source/drain region, the sacrificial layer exposing the preliminary gate electrode; selectively removing the preliminary gate electrode to form a groove exposing the active region and the device isolation layer; forming a gate insulating layer in the groove; forming a gate electrode on the gate insulating layer in the groove, the gate electrode including a metal nitride layer and a first metal layer which are sequentially stacked; sequentially forming a etch stop layer and a first interlayer insulating layer to cover the gate electrode and the source/drain region; etching the first interlayer insulating layer and the etch stop layer to form a first hole that exposes the source/drain region; depositing a second metal layer in the first hole and thermally treating the second metal layer to form a metal silicide layer on the exposed source/drain region; removing an unreacted residue of the second metal layer by a wet cleaning process; and forming a first contact in the first hole.

In some embodiments, the source/drain region may be formed by a selective epitaxial growth (SEG) process performed on the substrate; and the source/drain region may have a top surface higher than a bottom surface of the gate electrode.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
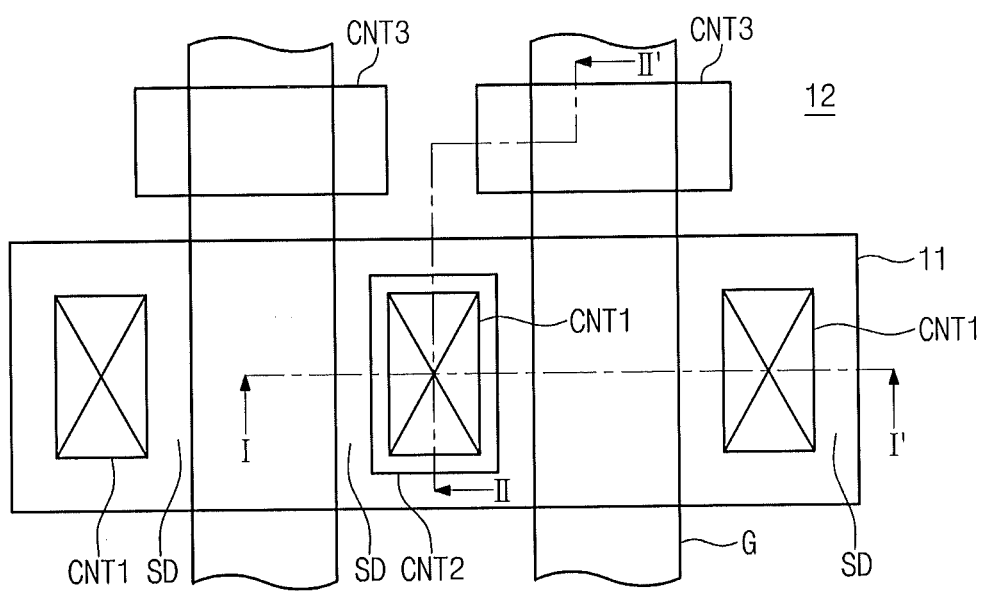
FIG. 1 is a plan view illustrating a layout of a semiconductor device according to example embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result of, for example, manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted regions. Thus, the regions illustrated in the figures are schematic in nature and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. In addition, a phrase "at least one" is used herein to indicate that one or more respective components may be used in any combination.

A semiconductor device described herein may be a semiconductor memory device, a semiconductor non-memory device, and/or a driving device for driving the semiconductor memory or non-memory device.

Hereinafter, the inventive concepts and embodiments of the inventive concepts will be described in detail with reference to the drawings.

FIG. 1 is a plan view illustrating a layout of a semiconductor device according to example embodiments of the inventive concept. Referring to FIG. 1, a semiconductor device according to the inventive concepts includes a substrate having an active region 11 and a device isolation layer 12 defining the active region 11. A gate G (i.e., a gate electrode) may be provided on the active region 11 to extend onto the device isolation layer 12. Source/drain regions SD are provided in the active region 11 at both sides of the gate G. A first contact CNT1 may be connected to the source/drain region SD. A second contact CNT2 may be provided on the first contact CNT1. The second contact CNT2 is connected to the first contact CNT1. A third contact CNT3 may be provided that is connected to a portion of the gate G that is disposed on the device isolation layer 12.

A method of forming a semiconductor device according to some embodiments will be described hereinafter. FIGS. 2A to 2K are cross-sectional views taken along lines I-I' and II-II' of FIG. 1 to illustrate a method of forming a semiconductor device according to some embodiments of the inventive concept.

Figure 2A:
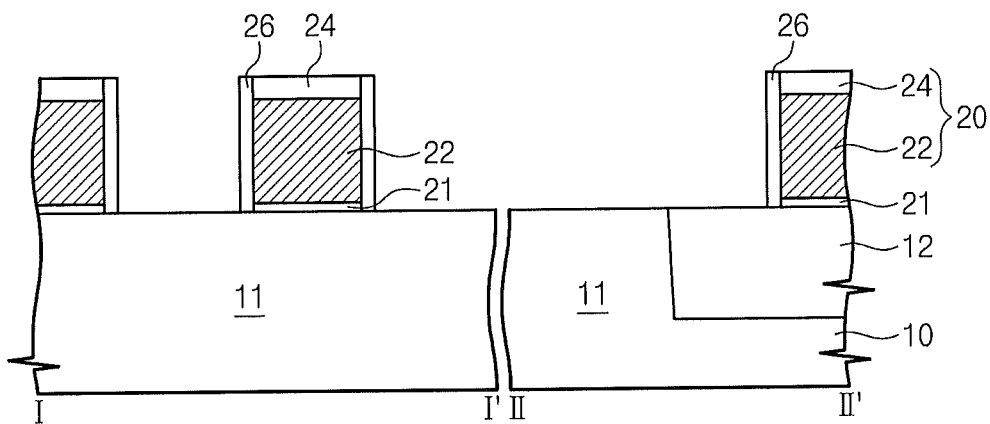
FIGS. 2A to 2K are cross-sectional views taken along lines I-I' and II-II' of FIG. 1 to illustrate a method of forming a semiconductor device according to some embodiments of the inventive concept.

Referring to FIG. 2A, a substrate 10 is provided. The substrate 10 may be a silicon substrate. The substrate 10 may include one selected from a group consisting of single-crystalline silicon, silicon-on-insulator (SOI), and silicon-germanium (SiGe), although other materials may be used. The substrate 10 may have a first conductivity type (e.g., P-type).

An active region 11 may be defined in the semiconductor substrate between one or more device isolation regions 12.

Preliminary gates 20 may be formed on the substrate 10. A buffer layer 21 may be formed between the active region 11 and one of the preliminary gates 20. The buffer layer 21 may be a silicon oxide layer. The preliminary gates 20 may include a first sacrificial layer 22. The preliminary gates 20 may further include a hard mask pattern 24 disposed on the first sacrificial layer 22. The first sacrificial layer 22 may have a wet etch selectivity with respect to a silicon oxide layer. For example, the first sacrificial layer 22 may be a poly-silicon layer. The hard mask pattern 24 may be a silicon nitride layer. The first sacrificial layer 22 may be patterned by an etching process using the hard mask pattern 24 as an etch mask. The preliminary gates 20 may cross the active region 11 and extend onto the device isolation layer 12. Sidewall spacers 26 may be formed on sidewalls of the preliminary gates 20. The sidewall spacer 26 may include a silicon oxide layer and/or a silicon nitride layer.

Figure 2B:
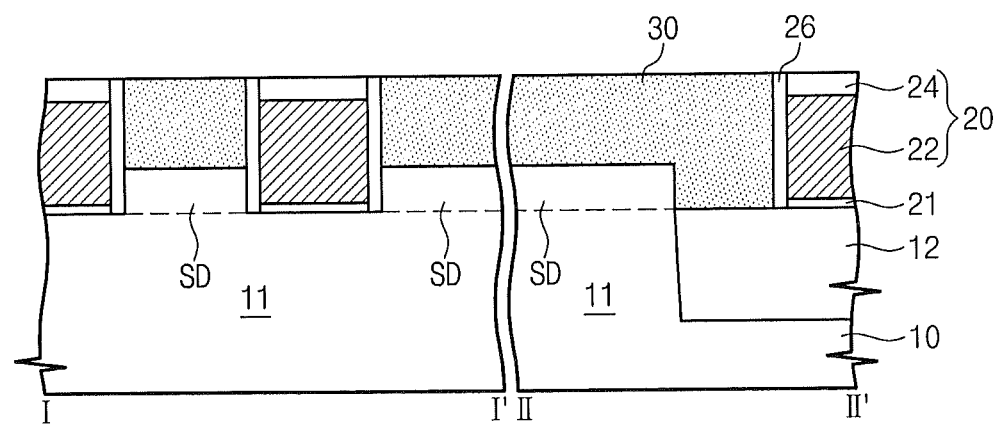

Referring to FIG. 2B, source/drain regions SD may be formed in the active region 11 at both sides of each preliminary gate 20. The source/drain regions SD may be a silicon layer formed by a selective epitaxial growth (SEG) process on the substrate 10. The source/drain regions SD may have a second conductivity type (e.g., N-type). The source/drain regions SD may have an elevated portion that extends above the substrate 10 so that top surfaces of the source/drain regions SD are higher than bottom surfaces of the preliminary gates 20. Due to the SEG process, the source/drain regions SD may have a protrusion P that extends onto the device isolation layer 12. (See FIG. 3A)

A second sacrificial layer 30 may be formed on the source/drain regions SD and the preliminary gates 20. The second sacrificial layer 30 may include a material having a wet etch selectivity with respect to a silicon oxide layer. For example, the second sacrificial layer 30 may include phospho-silicate-glass (PSG) or boro-phospho-silicate-glass (BPSG). The second sacrificial layer 30 may be planarized to expose the preliminary gates 20. The planarized second sacrificial layer 30 covers the source/drain regions SD.

Figure 2C:
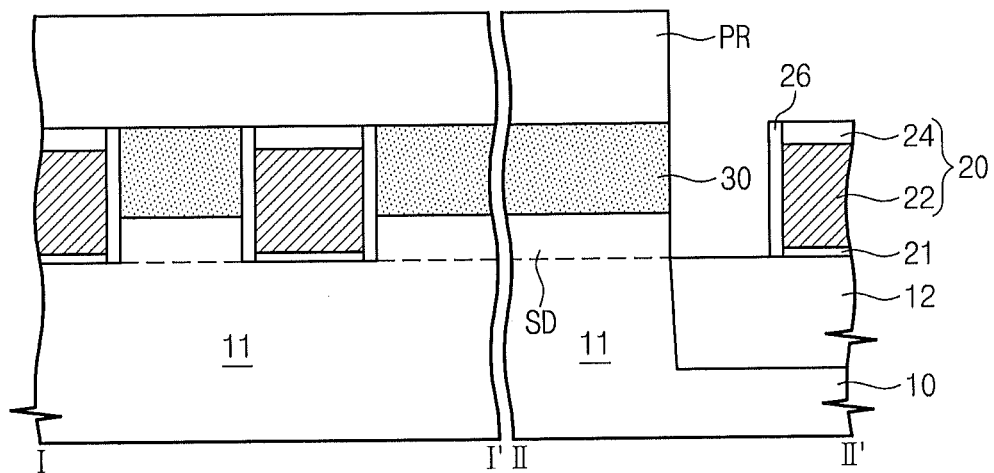

Referring to FIG. 2C, a photoresist PR may be formed to cover the active region 11. The second sacrificial layer 30 may be removed using the photoresist PR as an etch mask. Thus, the device isolation layer 12 not covered by the preliminary gate 20 may be exposed.

Figure 2D:
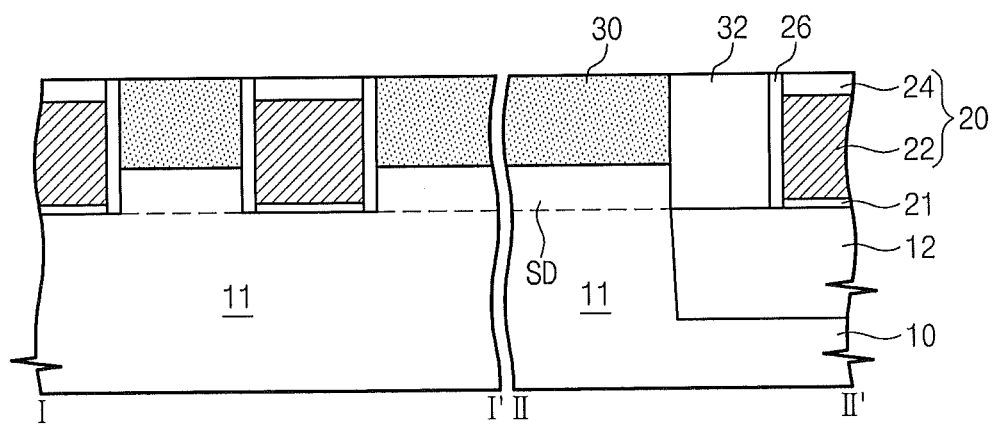

Referring to FIG. 2D, a buffer insulating layer 32 may be formed to cover the second sacrificial layer 30. The buffer insulating layer 32 may be formed of a material having a wet etch selectivity with respect to the second sacrificial layer 30. For example, the buffer insulating layer 32 may be a silicon oxide layer. In particular, the buffer insulating layer 32 may be, for example, a tetraethyl orthosilicate (TEOS) layer. The buffer insulating layer 32 may be planarized to expose the preliminary gates 20. Thus, the planarized buffer insulating layer 32 is provided on the device isolation layer 12 and a top surface of the planarized buffer insulating layer 32 is higher than the top surface of the source/drain region SD.

Figure 2E:
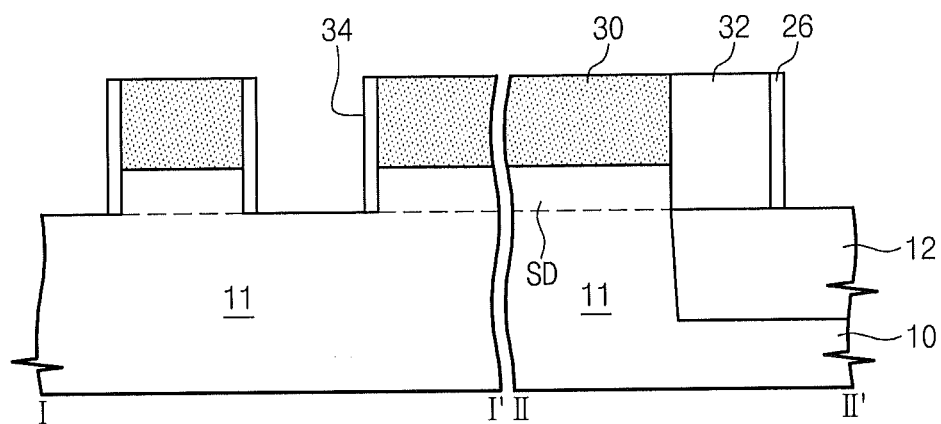

Referring to FIG. 2E, the preliminary gates 20 may be selectively removed. If the hard mask pattern 24 is a silicon nitride layer, the hard mask pattern 24 may be removed by a wet or dry etching process having an etch selectivity with respect to the second sacrificial layer 30 (e.g., a silicon oxide layer) and the buffer insulating layer 32 (e.g., a silicon oxide layer). If the first sacrificial layer 22 is formed of the polysilicon layer, the first sacrificial layer 22 may be removed using a wet etching solution including nitric acid. Subsequently, the buffer layer 21 may be removed. The buffer layer 21 may be removed by a wet etching solution including hydrofluoric acid. Thus, gate grooves 34 that expose the active region 11 and the device isolation layer 12 may be formed.

Figure 2F:
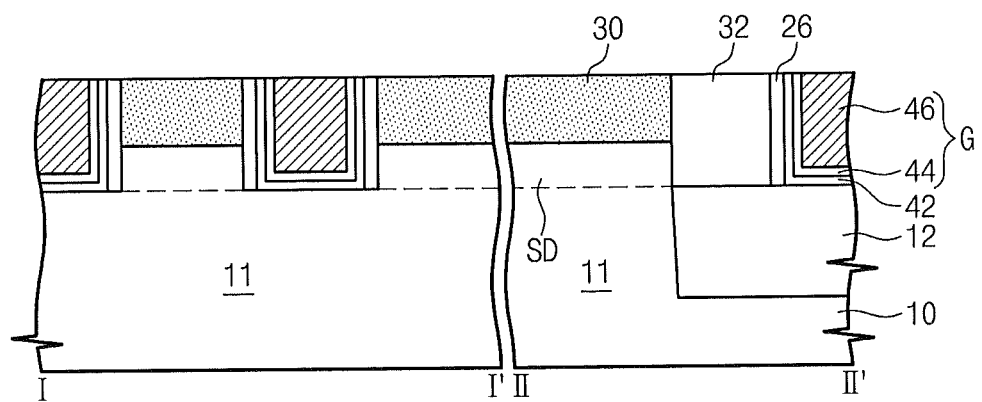

Referring to FIG. 2F, a gate insulating layer 42 is formed in the gate grooves 34. The gate insulating layer 42 may include at least one of silicon oxide, silicon nitride, silicon oxynitride, metal silicate, and insulating high-k refractory metal oxide (e.g., hafnium oxide and/or aluminum oxide). In particular, the gate insulating layer 42 may include a refractory metal oxide layer, a refractory metal silicon oxide layer, or a refractory metal silicon oxynitride layer. For example, the gate insulating layer 42 may include a hafnium oxide layer, a hafnium silicon oxide layer, or a hafnium silicon oxynitride layer.

Gates G that act as gate electrodes are formed on the gate insulating layer 42. In some embodiments, a gate material may be deposited to fill at least a portion of the gate groove 34 and then the deposited gate material may be planarized until the second sacrificial layer 30 and the buffer insulating layer 32 are exposed, thereby forming the gates G. Heights of the second sacrificial layer 30 and the buffer insulating layer 32 may be reduced by the planarization process performed on the gate material. Each gate G may include a metal nitride layer 44 and a first metal layer 46 which are sequentially stacked. The metal nitride layer 44 may include a titanium nitride layer or a tantalum nitride layer. For example, the first metal layer 46 may include titanium, aluminum, and/or tungsten which may be sequentially stacked.

Figure 2G:
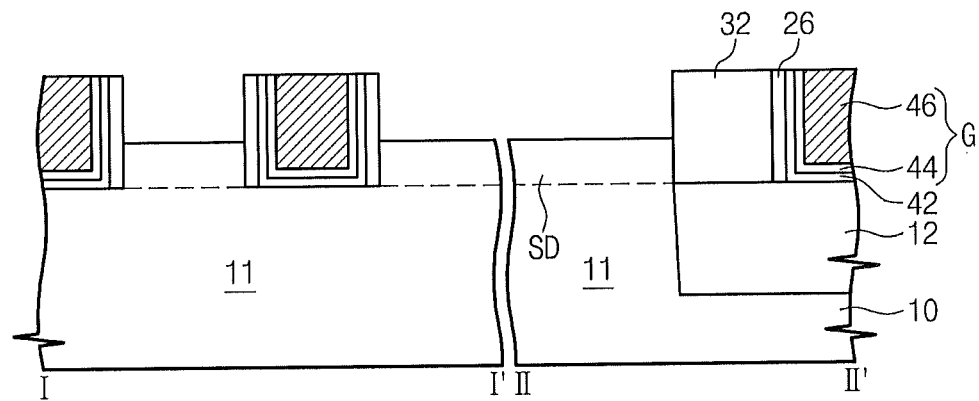

Referring to FIG. 2G, the second sacrificial layer 30 is selectively removed. The second sacrificial layer 30 may be removed using, for example, a wet etching solution including hydrofluoric acid (HF). Generally, a ratio of an etch rate of BPSG to an etch rate of TEOS by an etching solution including hydrofluoric acid may have a range of about 30:1 to about 60:1 according to addition of an organic material (e.g., acetic acid, formic acid, and/or oxalic acid) to the etching solution.

Figure 2H:
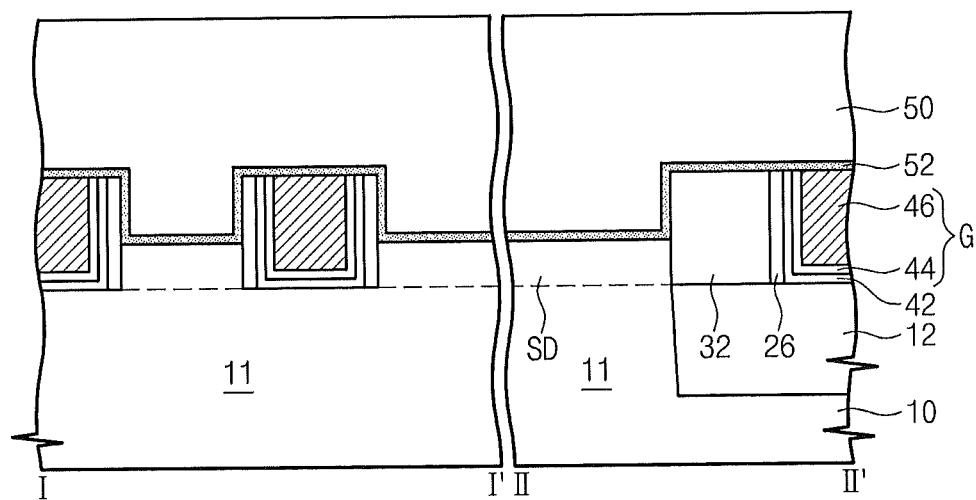

Referring to FIG. 2H, a first etch stop layer 52 and a first interlayer insulating layer 50 may be sequentially formed on the gates G and the source/drain regions SD. The first interlayer insulating layer 50 may be planarized to have a substantially flat top surface. The first etch stop layer 52 may include a silicon nitride layer, a silicon carbonitride (SiCN) layer, or a silicon oxynitride layer. The first interlayer insulating layer 50 may include silicon oxide.

Figure 2I:
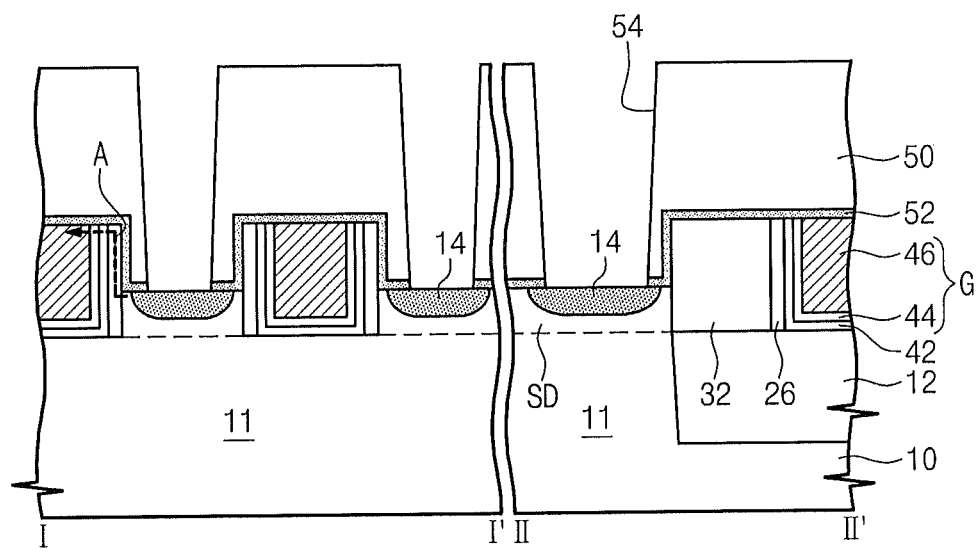

Referring to FIG. 2I, the first interlayer insulating layer 50 and the first etch stop layer 52 may be successively etched to form first openings 54 (e.g., first holes) that expose the source/drain regions SD. A metal silicide layer 14 may be formed on the source/drain regions SD that are exposed by the first openings 54. The formation process of the metal silicon layer 14 may include a process of forming a second metal layer in the first opening 54 and a thermal treatment process. The second metal layer may include nickel (Ni). The second metal layer may further include platinum of about 1 wt % to about 15 wt %.

Due to the thermal treatment process, the second metal layer may react with silicon of the source/drain regions SD to form the metal silicide layer 14. For example, the thermal treatment process may be performed at a temperature of about 200 degrees Celsius to about 400 degrees Celsius. Most of the second metal layer may be converted into the metal silicide layer 14. However, some portion of the second metal layer may not react with silicon, and instead may remain in an unreacted state. The unreacted residue of the second metal layer may cause errors during operation of the semiconductor device. Thus, the unreacted residue of the second metal layer should be removed. A metal etching solution may be used for removing the unreacted residue of the second metal layer. The metal etching solution may include sulfuric acid and oxygenated water. In conventional semiconductor devices, the metal etching solution may permeate into the gates G. Thus, the gate insulating layer 42, the metal nitride layer 44 and/or the first metal layer 46 may be etched by the metal etching solution. However, according to embodiments of the inventive concept, a permeation distance of the metal etching solution can greatly increase. Thus, the etching of the gate G and/or the gate insulating layer 42 by the metal etching solution may be reduced or minimized.

Figure 2J:
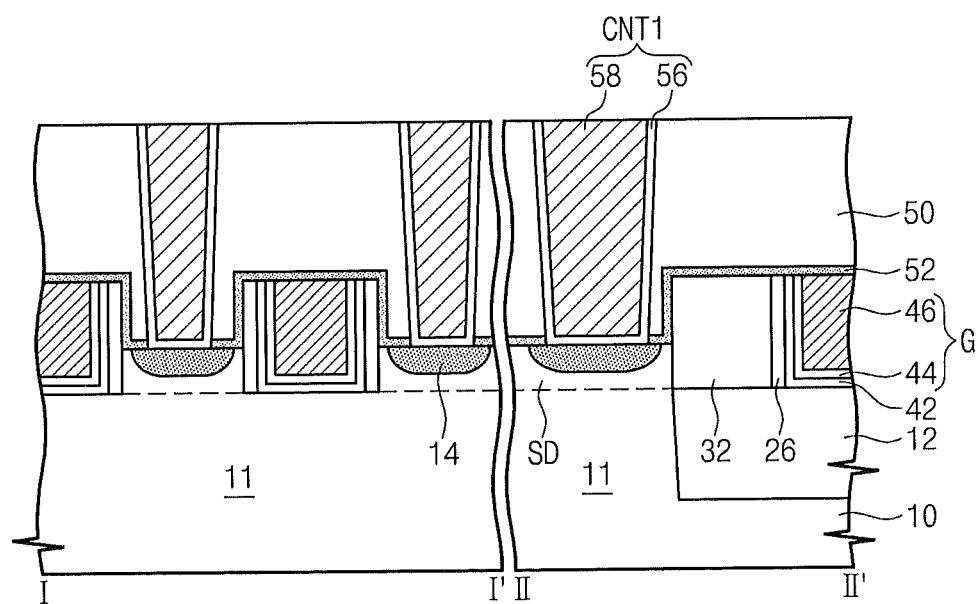

Referring to FIG. 2J, first contacts CNT1 may be formed in the first opening 54. In some embodiments, a barrier metal layer 56 and a third metal layer 58 may be sequentially formed and then the layers 56 and 58 may be planarized until the first interlayer insulating layer 50 is exposed to form the first contacts CNT1. The barrier metal layer 56 may be a titanium nitride layer. The third metal layer 58 may include tungsten.

Figure 2K:
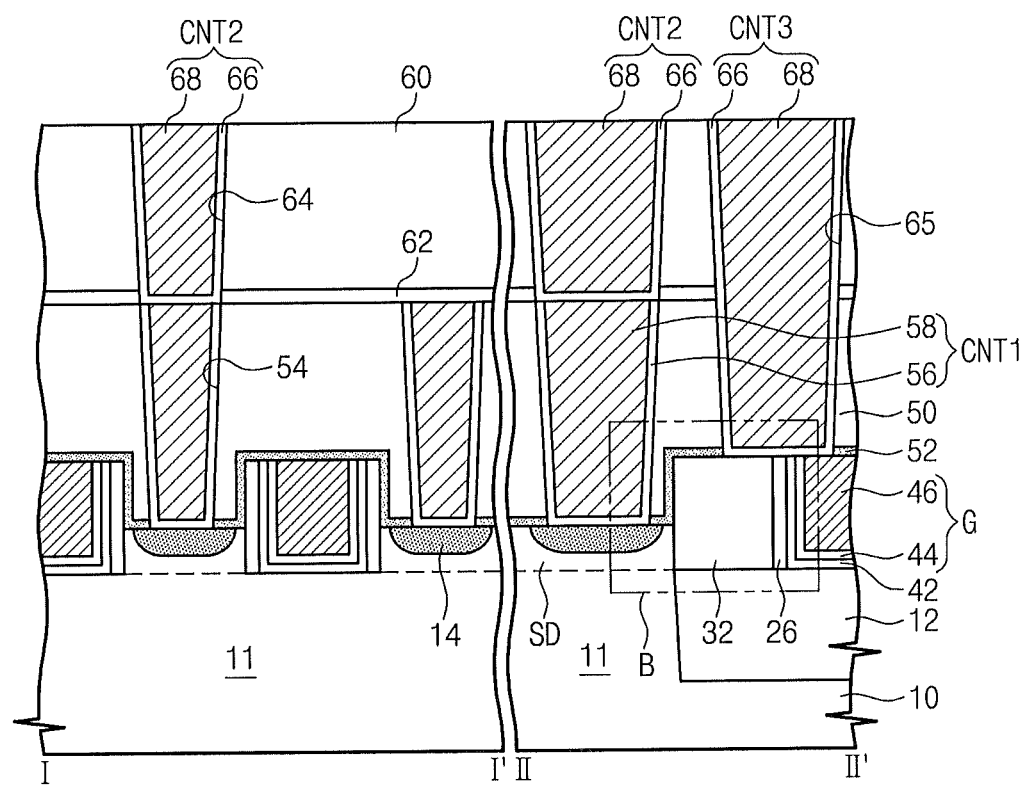

Referring to FIG. 2K, a second interlayer insulating layer 60 may be formed on the first interlayer insulating layer 50. The second interlayer insulating layer 60 may include silicon oxide. A second etch stop layer 62 may be formed between the first interlayer insulating layer 50 and the second interlayer insulating layer 60. The second etch stop layer 62 may be a silicon nitride layer, a silicon carbonitride layer, or a silicon oxynitride layer.

The second interlayer insulating layer 60 and the second etch stop layer 62 may be successively etched to form a second opening 64 (e.g., a second hole) that exposes the first contact CNT1. At the same time, the second interlayer insulating layer 60, the second etch stop layer 62, the first interlayer insulating layer 50 and the first etch stop layer 52 may be successively etched to form a third opening 65 (e.g., a third hole) that exposes the gate G and the buffer insulating layer 32 adjacent to the gate G. The top surface of the buffer insulating layer 32 may be recessed by the formation of the third opening 65.

A second contact CNT2 and a third contact CNT3 may be formed in the second opening 64 and the third opening 65, respectively. Forming the second and third contacts CNT2 and CNT3 may include sequentially forming a barrier metal layer 66 and a fourth metal layer 68, and planarizing the fourth metal layer 68 and the barrier metal layer 66 until the second interlayer insulating layer 60 is exposed. The barrier metal layer 66 may be a titanium nitride layer. The fourth metal layer 68 may include tungsten. A bottom surface of the third contact CNT3 may be in contact with the top surface of the gate G and the top surface of the buffer insulating layer 32. The bottom surface of the third contact CNT3 is formed to be higher above the substrate 10 than is the top surface of the source/drain regions SD.

A semiconductor device according to some embodiments of the inventive concept will be discussed hereinafter. Referring to FIGS. 1 and 2K, the semiconductor device includes a substrate 10 having an active region 11 and a device isolation layer 12 defining the active region 11. The substrate 10 may be a silicon substrate. The substrate 10 may include one selected from a group consisting of single-crystalline silicon, silicon-on-insulator (SOD, and silicon-germanium (SiGe). The substrate 10 may have a first conductivity type (e.g., a P-type).

Gates G may be provided on the active region 11 and may extend onto the device isolation layer 12. The gates G may include a metal nitride layer 44 and a first metal layer 46 which are sequentially stacked. The metal nitride layer 44 may include a titanium nitride layer or a tantalum nitride layer. For example, the first metal layer 46 may include titanium, aluminum, and/or tungsten which may be sequentially stacked.

A gate insulating layer 42 is formed between the gates G and the substrate 10, The gate insulating layer 42 may include at least one of silicon oxide, silicon nitride, silicon oxynitride, metal silicate, and insulating high-k refractory metal oxide (e.g., hafnium oxide and/or aluminum oxide). In particular, the gate insulating layer 42 may include a refractory metal oxide layer, a refractory metal silicon oxide layer, or a refractory metal silicon oxynitride layer. For example, the gate insulating layer 42 may include a hafnium oxide layer, a hafnium silicon oxide layer, or a hafnium silicon oxynitride layer.

Sidewall spacers 26 may be disposed on sidewalls of the gates G. The sidewall spacers 26 may include a silicon oxide layer and/or a silicon nitride layer.

Source/drain regions SD are provided on the active region 11 at both sides of each gate G. The source/drain regions SD may be a silicon layer formed by a selective epitaxial growth (SEG) process on the substrate 10. The source/drain regions SD may have a second conductivity type (e.g., N-type). The source/drain regions SD may have an elevated portion that extends above the substrate 10 so that a top surface of each source/drain region SD is higher than bottom surfaces of the gates G. Due to the SEG process, the source/drain region SD may have a protrusion P extending onto the device isolation layer 12. (See FIG. 3A) A metal silicide layer 14 may be provided in an upper portion of the source/drain regions SD.

A buffer insulating layer 32 is provided on the device isolation layer 12. The buffer insulating layer 32 may be a silicon oxide layer. The buffer insulating layer 32 may expose the gate G. The buffer insulating layer 32 may have a similar height similar to the gate G. A top surface of the buffer insulating layer 32 is higher than the top surface of the source/drain regions SD.

A first etch stop layer 52 and a first interlayer insulating layer 50 may be sequentially provided on the gates G, the buffer insulating layer 32 and the source/drain regions SD. The first etch stop layer 52 may be a silicon nitride layer, a silicon carbonitride layer, or a silicon oxynitride layer. The first interlayer insulating layer 50 may include silicon oxide.

The first interlayer insulating layer 50 may include first openings 54 that expose the metal silicide layer 14 of the source/drain regions SD. First contacts CNT1 may be disposed in the first openings 54. The first contacts CNT1 may include a barrier metal layer 56 and a third metal layer 58 which are sequentially stacked. The barrier metal layer 56 may be a titanium nitride layer. The third metal layer 58 may include tungsten.

A second interlayer insulating layer 60 may be disposed on the first interlayer insulating layer 50. The second interlayer insulating layer 60 may include silicon oxide. A second etch stop layer 62 may be provided between the first interlayer insulating layer 50 and the second interlayer insulating layer 60. The second etch stop layer 62 may be a silicon nitride layer, a silicon carbonitride layer, or a silicon oxynitride layer.

The first contacts CNT1 may be connected to the respective source/drain regions SD. A second contact CNT2 may be disposed on one of the first contacts CNT1. The second contact CNT2 is connected to the first contact CNT1. A third contact CNT3 may be provided that is connected to a portion of the gate G that is disposed on the device isolation layer 12.

The second interlayer insulating layer 60 may have a second opening 64 that exposes the first contact CNT1. A third opening 65 may penetrate the second interlayer insulating layer 60, the second etch stop layer 62, the first interlayer insulating layer 50, and the first etch stop layer 52. The third opening 65 may be spaced apart from the second opening 64. The third opening 65 may expose the gate G and the buffer insulating layer 32 adjacent to the gate G.

The second contact CNT2 and the third contact CNT3 may be disposed in the second opening 64 and the third opening 65, respectively. Each of the second and third contacts CNT2 and CNT3 may include a barrier metal layer 66 and a fourth metal layer 68 which are sequentially stacked. The barrier metal layer 66 may be a titanium nitride layer. The fourth metal layer 68 may include tungsten. A bottom surface of the third contact CNT3 may be in contact with the top surface of the gate G and the top surface of the buffer insulating layer 32. The bottom surface of the third contact CNT3 is higher than the top surface of the source/drain regions SD.

Figure 3A:
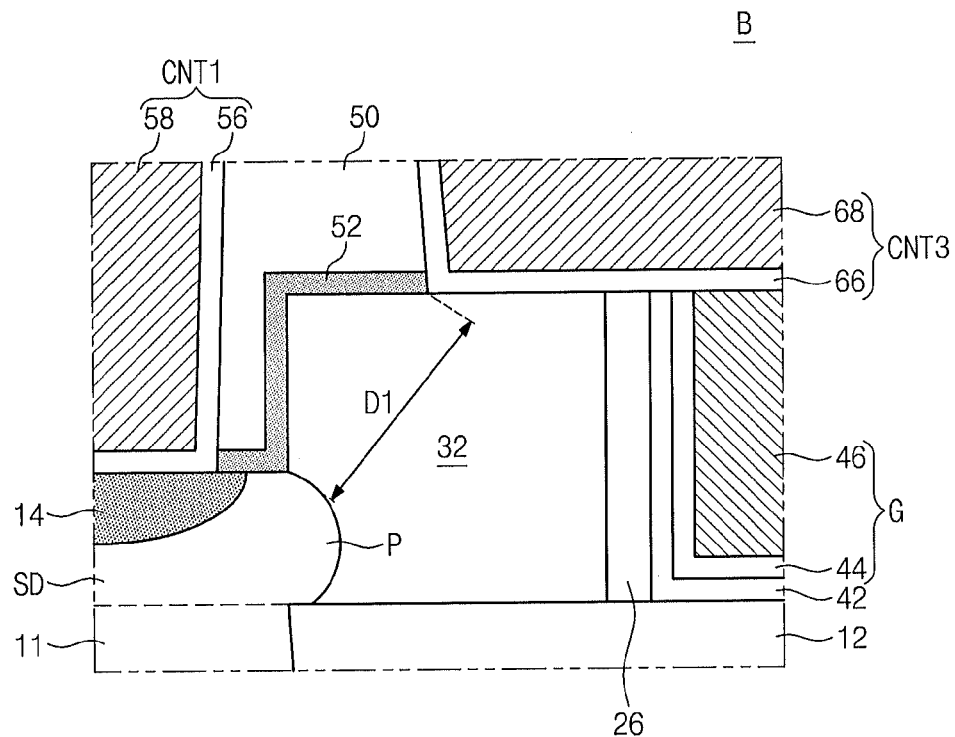
FIG. 3A is an enlarged view of a portion 'B' of FIG. 2K of a semiconductor device according to some embodiments of the inventive concept.
Figure 3B:
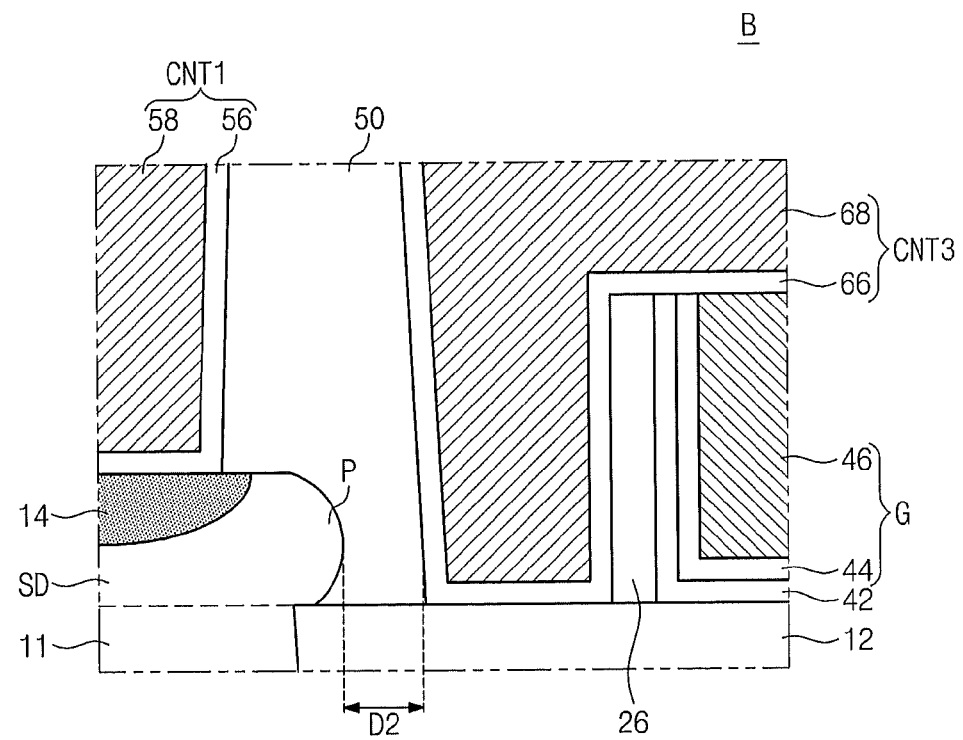
FIG. 3B is an enlarged view of a portion of a conventional semiconductor device that corresponds to portion 'B' of FIG. 2K.

FIG. 3A is an enlarged view of a portion 'B' of FIG. 2K in a semiconductor device according to some embodiments of the inventive concept. FIG. 3B is an enlarged view of a portion of a conventional semiconductor device that corresponds to the portion 'B' of FIG. 2K.

Referring to FIG. 3A, the semiconductor device according to embodiments of the inventive concept includes the buffer insulating layer 32 on the device isolation layer 12. The bottom surface of the third contact CNT3 may be higher than the top surface of the source/drain region SD and may be disposed at a similar height to the top surface of the gate G. The source/drain region SD may have the protrusion P protruding from the active region 11 onto the device isolation layer 12. A distance between the source/drain region SD and the third contact CNT3 may be a first distance D1 illustrated in FIG. 3A.

Referring to FIG. 3B, a conventional semiconductor device does not include the buffer insulating layer 32 on the device isolation layer 12. Thus, a bottom surface of a third contact CNT3 may be disposed at a similar height to the top surface of the device isolation layer 12 and may be adjacent to the source/drain region SD. A distance between the source/drain region SD and the third contact CNT3 of the conventional semiconductor device may be a second distance D2 illustrated in FIG. 3B. The second distance D2 may be very small, so that the third contact CNT3 may easily contact the source/drain region SD in the conventional semiconductor device due to, for example, misalignment of masks or the like. Thus, electrical characteristics and reliability of the conventional semiconductor device may be deteriorated.

As a result, the distance D1 between the source/drain region SD and the third contact CNT3 in the semiconductor device according to the inventive concept may be greater than the distance D2 between the source/drain region SD and the third contact CNT3 in the conventional semiconductor device (D1>D2). Thus, electrical characteristics and reliability of the semiconductor device according to the inventive concept may be improved.

Figure 4A:
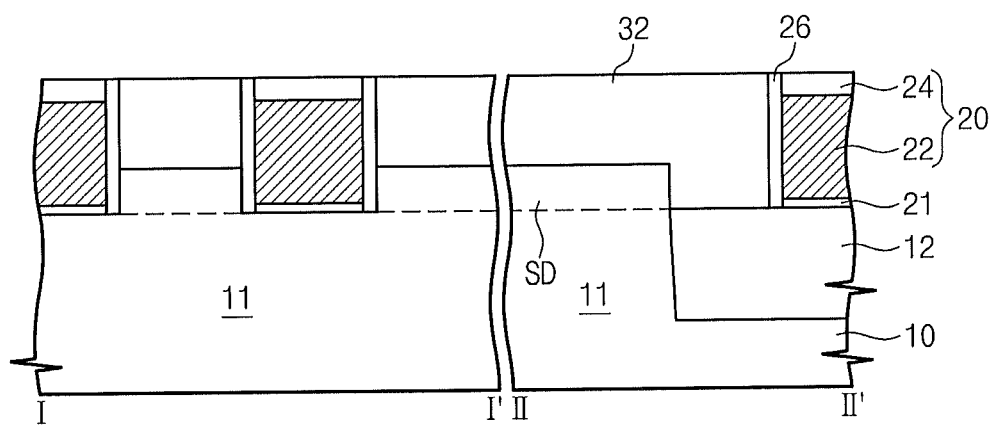
FIGS. 4A to 4C are cross-sectional views taken along lines I-I' and II-II' of FIG. 1 to illustrate a method of forming a semiconductor device according to further embodiments of the inventive concept.
Figure 4B:
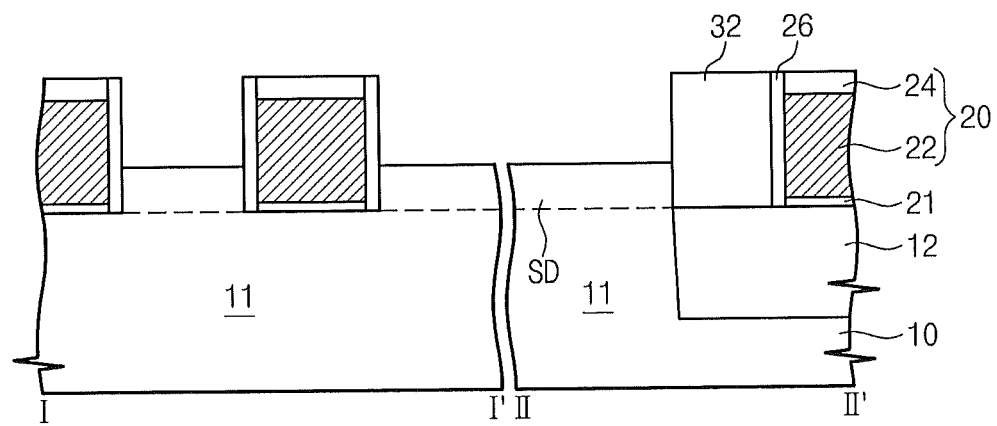
Figure 4C:
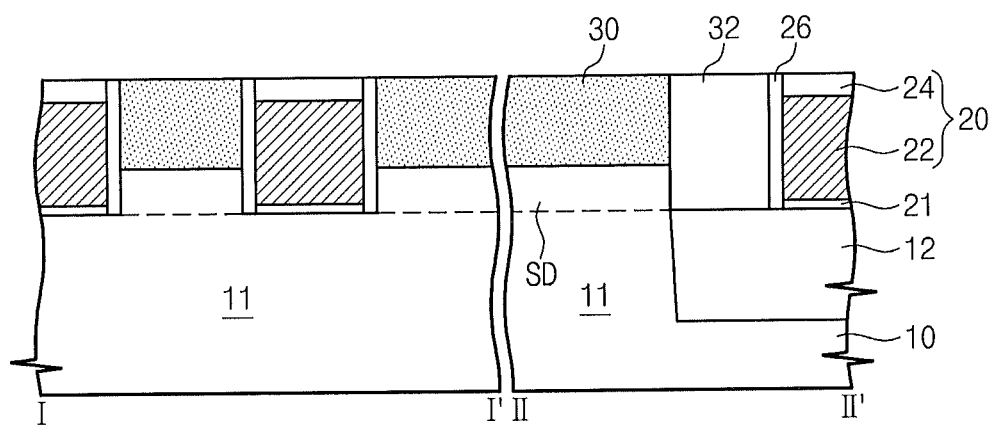

A method of forming a semiconductor device according to other embodiments will be described. FIGS. 4A to 4C are cross-sectional views taken along lines I-I' and II-II' of FIG. 1 to illustrate a method of forming a semiconductor device according to further embodiments of the inventive concept.

Referring to FIG. 4A, a buffer insulating layer 32 may be formed on the source/drain regions SD described with reference to FIGS. 2A and 2B. For example, the buffer insulating layer 32 may be a silicon oxide layer (e.g., a TEOS layer). The buffer insulating layer 32 may be planarized to expose the preliminary gates 20.

Referring to FIG. 4B, the buffer insulating layer 32 on the active region 11 may be removed by a patterning process using a photoresist (not shown). Thus, the buffer insulating layer 32 may only remain on the device isolation layer 12, and a top surface of the buffer insulating layer 32 is higher than the top surface of the source/drain region SD. The buffer insulating layer 32 may have a top surface disposed at the same height as the top surface of the preliminary gates 20.

Referring to FIG. 4C, a second sacrificial layer 30 may be formed on the source/drain regions SD, the buffer insulating layer 32 and the preliminary gates 20. The second sacrificial layer 30 may include a material having a wet etch selectivity with respect to a silicon oxide layer. For example, the second sacrificial layer 30 may include PSG or BPSG. The second sacrificial layer 30 may be planarized to expose the preliminary gates 20 and the buffer insulating layer 32. The planarized second sacrificial layer 30 covers the source/drain regions SD.

Thereafter, the same processes as mentioned with reference to FIGS. 2E to 2K may be performed.

A method of forming a semiconductor device according to still further embodiments will be described. FIGS. 5A to 5H are cross-sectional views taken along lines I-I' and II-II' of FIG. 1 to illustrate a method of forming a semiconductor device according to these further embodiments of the inventive concept.

Figure 5A:
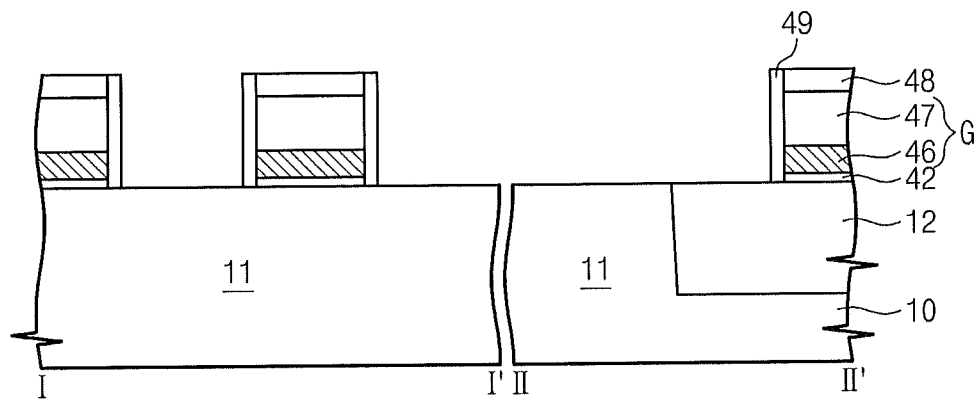
FIGS. 5A to 5H are cross-sectional views taken along lines I-I' and II-II' of FIG. 1 to illustrate a method of forming a semiconductor device according to still further embodiments of the inventive concept.

Referring to FIG. 5A, a gate insulating layer 42 may be formed on the substrate 10. The gate insulating layer 42 may include at least one of silicon oxide, silicon nitride, silicon oxynitride, metal silicate, and insulating high-k refractory metal oxide (e.g., hafnium oxide and/or aluminum oxide). In particular, the gate insulating layer 42 may include a refractory metal oxide layer, a refractory metal silicon oxide layer, or a refractory metal silicon oxynitride layer. For example, the gate insulating layer 42 may include a hafnium oxide layer, a hafnium silicon oxide layer, or a hafnium silicon oxynitride layer.

Gates G may be formed on the gate insulating layer 42. Each gate G may include a first metal layer 46. The first metal layer 46 may include tungsten, molybdenum, titanium nitride, tungsten nitride, and/or tantalum nitride. The gate G may further include a poly-silicon layer 47 disposed on the first metal layer 46. The poly-silicon layer 47 may be doped with dopants of the second conductivity type (e.g., N-type). The first metal layer 46 and the poly-silicon layer 47 may be formed by a sputtering method. A thickness of the poly-silicon layer 47 may be thicker than a thickness of the first metal layer 46.

The poly-silicon layer 47 and the first metal layer 46 may be patterned using a mask pattern 48 as an etch mask to form the gates G. A sidewall spacer 49 may cover a sidewall of the gate G. The sidewall spacer 49 may include a silicon oxide layer and/or a silicon nitride layer.

Figure 5B:
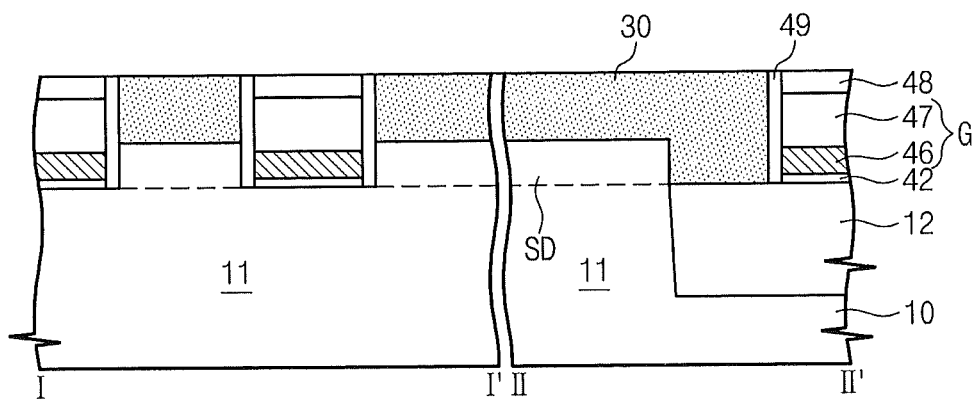

Referring to FIG. 5B, source/drain regions SD may be formed on the active region 11 at both sides of the gates G. The source/drain regions SD may each be a silicon layer formed by a selective epitaxial growth (SEG) process on the substrate 10. The source/drain regions SD may have the second conductivity type (e.g., N-type). The source/drain regions SD may each have an elevated portion that extends above the substrate 10 so that top surfaces of the source/drain regions SD are higher than bottom surfaces of the gates G.

The second sacrificial layer 30 may be formed on the source/drain regions SD and the gates G. The second sacrificial layer 30 may include a material having a wet etch selectivity with respect to a silicon oxide layer. For example, the second sacrificial layer 30 may include PSG or BPSG. The second sacrificial layer 30 may be planarized to expose the gates G. The planarized second sacrificial layer 30 covers the source/drain regions SD.

Figure 5C:
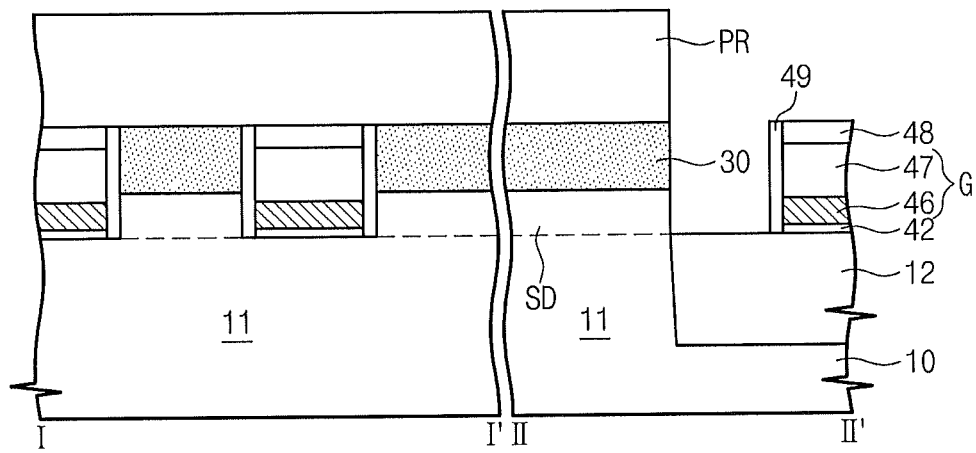
Figure 5D:
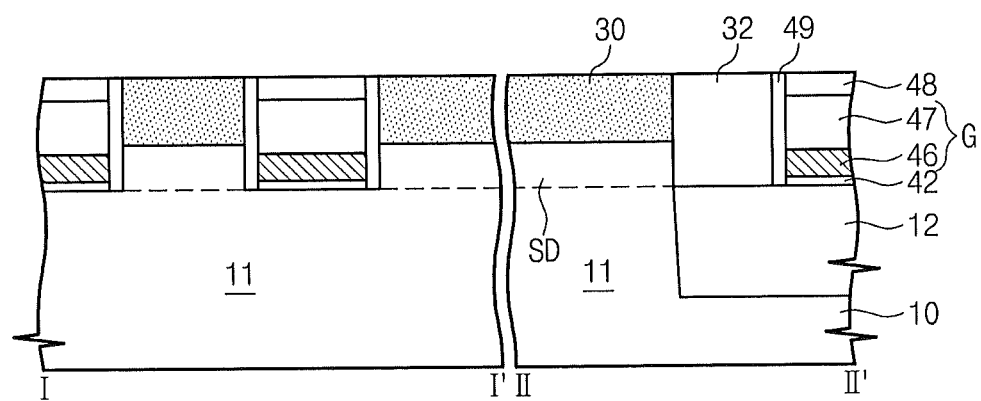

Referring to FIGS. 5C and 5D, the second sacrificial layer 30 may be formed on the active region 11 and the buffer insulating layer 32 may be formed on the device isolation layer 12, as described with reference to FIGS. 2C and 2D. The buffer insulating layer 32 may be, for example, a TEOS layer. The gates G, the second sacrificial layer 30 and the buffer insulating layer 32 may have top surfaces disposed at the same height.

Figure 5E:
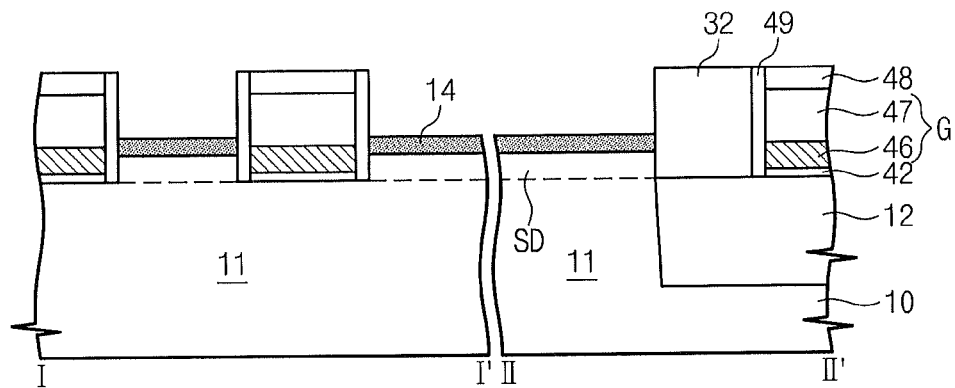

Referring to FIG. 5E, the second sacrificial layer 30 is selectively removed to expose the source/drain regions SD. The second sacrificial layer 30 may be removed by a wet etching solution including hydrofluoric acid.

A metal silicide layer 14 may be formed on the exposed source/drain regions SD. The formation method of the metal silicide layer 14 may be similar to the method described with reference to FIG. 2I.

Figure 5F:
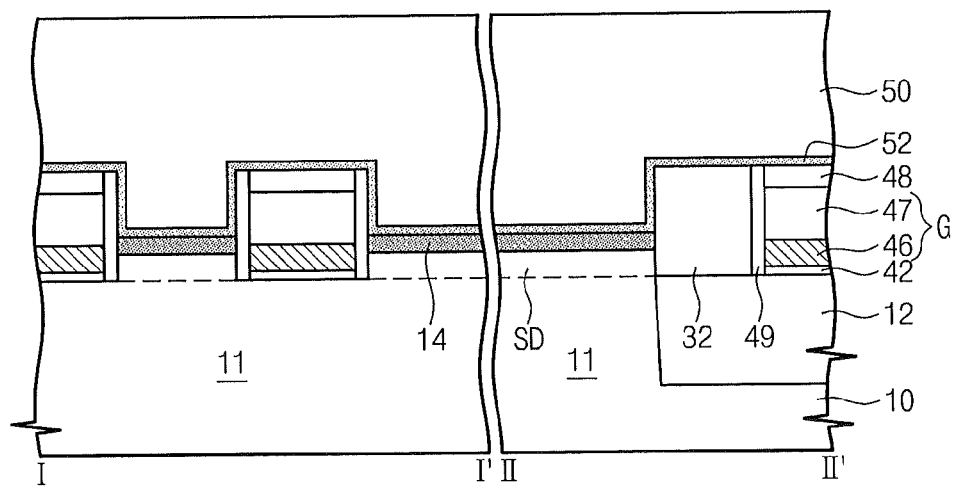

Referring to FIG. 5F, a first etch stop layer 52 and a first interlayer insulating layer 50 may be sequentially formed on the gates G and the source/drain regions SD. The first interlayer insulating layer 50 may be planarized to have a substantially flat top surface. The first etch stop layer 52 may include a silicon nitride layer, a silicon carbonitride layer, or a silicon oxynitride layer. The first interlayer insulating layer 50 may include silicon oxide.

Figure 5G:
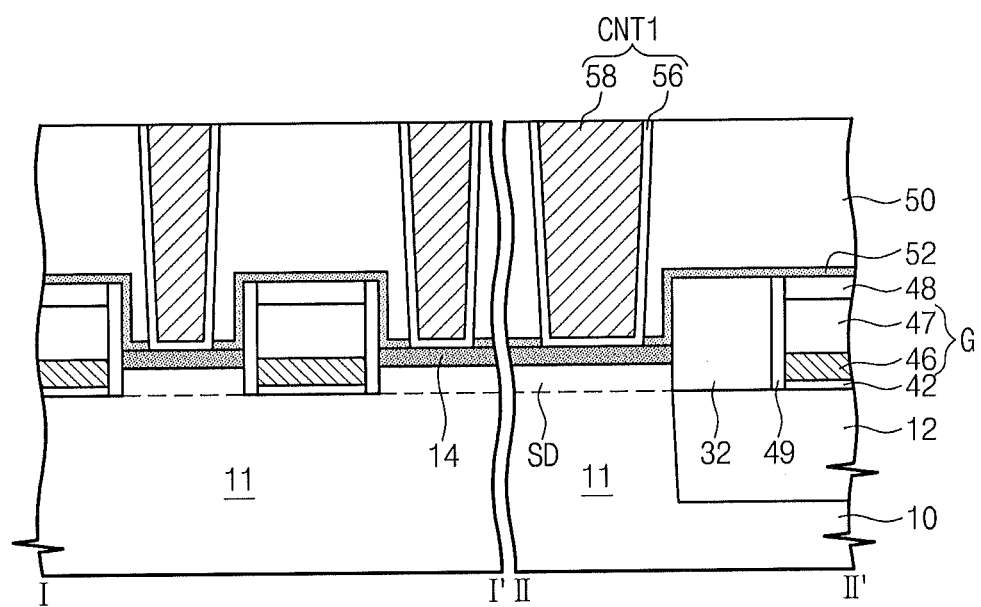
Figure 5H:
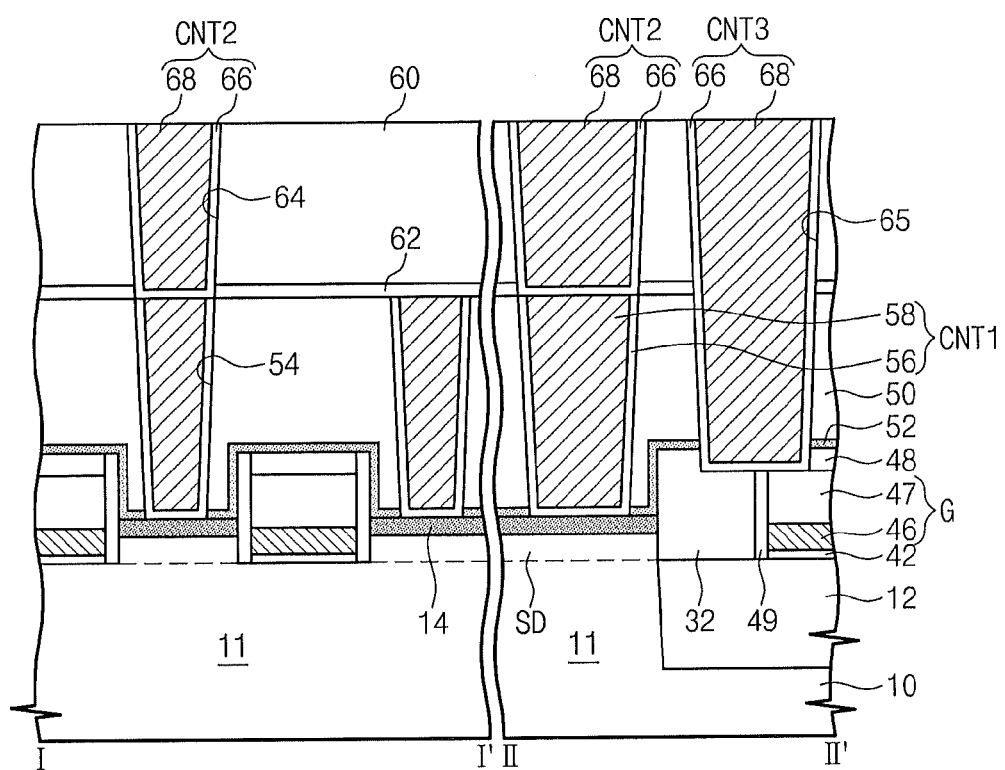

Referring to FIGS. 5G and 5H, processes that are the same as/similar to the processes of FIGS. 2I to 2K may be performed.

The method described with reference to FIGS. 4A to 4C may also be applied to the method of forming the semiconductor device according to the present embodiment.

The semiconductor device according to present embodiment in FIG. 5H may be similar to the semiconductor device illustrated in FIG. 2K. However, the structure of the gates G of the semiconductor device of FIG. 5H is different from the structure of the gates G of the semiconductor device of FIG. 2K. In other words, the gates G may include sequentially stacked first metal layer 46 and poly-silicon layer 47 in the present embodiment. For example, the first metal layer 46 may include tungsten, molybdenum, titanium nitride, tungsten nitride, and/or tantalum nitride. The poly-silicon layer 47 may be doped with the dopants of the second conductivity type (e.g., N-type). The mask pattern 48 may be additionally provided on the poly-silicon layer 47.

Figure 6:
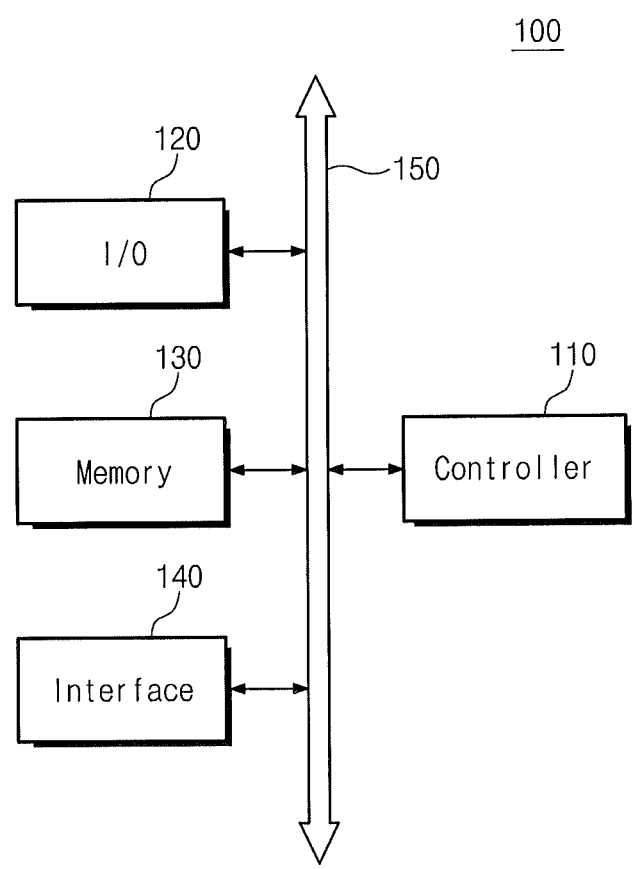
FIG. 6 is a schematic block diagram illustrating an example of electronic devices including semiconductor devices formed according to embodiments of the inventive concept.

FIG. 6 is a schematic block diagram illustrating an example of electronic devices including semiconductor devices formed according to embodiments of the inventive concept.

Referring to FIG. 6, an electronic device 100 according to embodiments of the inventive concept may include a controller 110, an input/output (I/O) unit 120, a memory device 130, an interface unit 140 and a data bus 150. At least two of the controller 110, the I/O unit 120, the memory device 130 and the interface unit 140 may communicate with each other through the data bus 150. The data bus 150 may correspond to a path through which electrical signals are transmitted.

The controller 110 may include at least one of a microprocessor, a digital signal processor, a microcontroller, or other logic devices having a similar function to any one of the microprocessor, the digital signal processor and the microcontroller. The I/O unit 120 may include a keypad, a keyboard and/or a display unit. The memory device 130 may store data and/or commands. The interface unit 140 may transmit electrical data to a communication network or may receive electrical data from a communication network. The interface unit 140 may operate by wireless or cable. For example, the interface unit 140 may include an antenna for wireless communication and/or a transceiver for cable communication. Although not shown in the drawings, the electronic device 100 may further include a fast DRAM device and/or a fast SRAM device which acts as a cache memory for improving an operation of the controller 110. At least the controller 110, the I/O unit 120, and the memory device 130 may include the semiconductor devices according to the aforementioned embodiments of the inventive concept.

The electronic device 100 may be applied to a personal digital assistant (PDA), a portable computer, a web tablet, a wireless phone, a mobile phone, a digital music player, a memory card or other electronic products. The other electronic products may receive or transmit information data by wireless communications.

Meanwhile, the semiconductor devices according to the aforementioned embodiments may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to embodiments of the inventive concept, damage of the metal layer of the gate may be reduced or prevented during the formation of the metal silicide layer. Additionally, the distance between the contact and the source/drain region increases to improve the reliability of the semiconductor device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a substrate having an active region and a device isolation layer that defines the active region;
    a gate electrode having first and second sidewalk on the active region;
    a source/drain region at a side of the gate electrode;
    first and second sidewall spacers on the respective sidewalls of the gate electrode;
    a buffer insulating layer on the device isolation layer between the first sidewall spacer and the source/drain region;
    an etch stop layer on the buffer insulating layer and extending onto the gate electrode and the source/drain region;
    a first interlayer insulating layer on the etch stop layer; and
    a first contact and a second contact each penetrating the first interlayer insulating layer and the etch stop layer, the first contact contacting the source/drain region, the second contact contacting the buffer insulating layer, and the first and second contacts spaced apart from each other,
    wherein the etch stop layer is on a planar top surface of the buffer insulating layer and on a planar sidewall of the buffer insulating layer.

2. The semiconductor device of claim 1, wherein a top surface of the buffer insulating layer is higher than a top surface of the source/drain region; and
    wherein the top surface of the buffer insulating layer is disposed at substantially the same height as a top surface of the gate electrode.

3. The semiconductor device of claim 1, wherein the gate electrode extends onto the device isolation layer; and
    wherein the second contact is in contact with a top surface of the gate electrode on the device isolation layer.

4. The semiconductor device of claim 3, wherein a bottom surface of the second contact is higher than a top surface of the source/drain region.

5. The semiconductor device of claim 3, wherein the source/drain region includes an elevated portion that extends above the substrate, the elevated portion including a protrusion that extends onto the device isolation layer; and
    wherein a top surface of the elevated portion is higher than a bottom surface of the gate electrode.

6. The semiconductor device of claim 5, wherein the source/drain region has a protrusion that extends onto the device isolation layer.

7. The semiconductor device of claim 3, further comprising:
    a second interlayer insulating layer on the first interlayer insulating layer; and
    a third contact penetrating the second interlayer insulating layer and contacting a top surface of the first contact,
    wherein the second contact further penetrates the second interlayer insulating layer; and
    wherein the second contact includes the same material as the third contact.

8. The semiconductor device of claim 4, wherein the gate electrode includes a metal nitride layer and aluminum or tungsten on the metal nitride layer.

9. The semiconductor device of claim 1, wherein the etch stop layer is on a top surface of the source/drain region.

10. The semiconductor device of claim 1, wherein the buffer insulating layer has a planar top surface.

11. A semiconductor device, comprising:
    a substrate having a device isolation region and an active region;
    a gate electrode on the substrate that crosses the active region and that includes a portion that extends onto the device isolation region;
    a source/drain region that extends above the substrate on a first side of the gate electrode;

a buffer insulating layer on the device isolation region between the source/drain region and the portion of the gate electrode that extends onto the device isolation region; and a contact on the portion of the gate electrode that extends onto the device isolation region and on the buffer insulation layer;

wherein a top surface of the buffer insulation layer is higher above the substrate than is a top surface of the source/drain region, wherein a portion of the source/drain region extends onto a top surface of the device isolation region, and wherein the buffer insulating layer directly contacts the portion of the source/drain region that extends onto the device isolation region.

12. The semiconductor device of claim 11, further comprising an etch stop layer on the source/drain region and on the buffer insulation layer, and wherein the buffer insulating layer has a planar top surface.

13. The semiconductor device of claim 12, wherein the contact comprises a first contact, the semiconductor device further comprising:

an interlayer insulating layer on the etch stop layer; and a second contact, wherein the first and second contacts each penetrate the interlayer insulating layer and the etch stop layer so that the first contact electrically connects to the gate electrode and the second contact electrically connects to the source/drain region, and wherein the first contact is spaced apart from the second contact.

14. The semiconductor device of claim 11, wherein the top surface of the buffer insulating layer is substantially coplanar with a top surface of the gate electrode.

15. The semiconductor device of claim 11, wherein the top surface of the source/drain region is higher above the substrate than is a bottom surface of the gate electrode.

16. The semiconductor device of claim 11, further comprising:

a first sidewall spacer on a first sidewall of the gate electrode, wherein the buffer insulating layer extends on the device isolation layer between the first sidewall spacer and the source/drain region.

17. The semiconductor device of claim 11, wherein a lower portion of a sidewall of the buffer insulating layer has a recess, and wherein the source/drain region extends into the recess.

18. The semiconductor device of claim 11, wherein a sidewall of the buffer insulating layer is aligned with a sidewall of the device isolation region.

19. A semiconductor device comprising:

substrate having an active region and a device isolation layer that defines the active region;

a gate electrode having first and second sidewalls on the active region;

a source/drain region at a side of the Tate electrode;

first and second sidewall spacers on the respective sidewalls of the gate electrode;

a buffer insulating layer on the device isolation layer between the first sidewall and the source/drain region;

an etch stop layer on the buffers insulating layer and extending onto the gate electrode and the source/drain region;

a first interlayer insulating layer on the etch stop layer; and a first contact and a second contact each penetrating the first interlayer insulating in er and the etch stop layer, the first contact contacting the source/drain region, the second contact contacting the buffer insulating layer, and the first and second contacts spaced apart from each other, wherein a sidewall of the buffer insulating layer is aligned with a sidewall of the device isolation layer.

* * * * *